(12) United States Patent
Koyama

(10) Patent No.: US 10,951,167 B2
(45) Date of Patent: Mar. 16, 2021

(54) SEMICONDUCTOR DEVICE

(71) Applicant: CANON KABUSHIKI KAISHA, Tokyo (JP)

(72) Inventor: Yasushi Koyama, Kamakura (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 188 days.

(21) Appl. No.: 15/736,529

(22) PCT Filed: May 23, 2016

(86) PCT No.: PCT/JP2016/002497
§ 371 (c)(1),
(2) Date: Dec. 14, 2017

(87) PCT Pub. No.: WO2016/203712
PCT Pub. Date: Dec. 22, 2016

(65) Prior Publication Data
US 2018/0152141 A1    May 31, 2018

(30) Foreign Application Priority Data

Jun. 15, 2015  (JP) .............................. JP2015-120403
May 12, 2016  (JP) .............................. JP2016-096255

(51) Int. Cl.
*H03B 7/08*    (2006.01)
*H03B 7/14*    (2006.01)
(Continued)

(52) U.S. Cl.
CPC ......... *H03B 7/08* (2013.01); *H01L 31/02005* (2013.01); *H01L 31/02327* (2013.01);
(Continued)

(58) Field of Classification Search
CPC .... H03B 7/08; H03B 7/14; H03B 2200/0044; H03B 2200/0084; H01Q 9/0414;
(Continued)

(56) References Cited

U.S. PATENT DOCUMENTS 7,653,371 B2 *  1/2010  Floyd ................... G02B 26/001
                                                     359/578
8,319,565 B2 * 11/2012  Sekiguchi ................ H03B 7/08
                                                     331/107 R
(Continued)

FOREIGN PATENT DOCUMENTS

JP    2007-324257 A    12/2007
JP     2008-11490 A     1/2008
(Continued)

OTHER PUBLICATIONS

Masahiro Asada et al.; "Resonant Tunneling Diodes for Sub-Terahertz and Terahertz Oscillators;" Japanese Journal of Applied Physics; vol. 47, No. 6, 2008, pp. 4375-4384.

*Primary Examiner* — Richard Tan
(74) *Attorney, Agent, or Firm* — Canon U.S.A., Inc. IP Division

(57) ABSTRACT

A semiconductor device that generates or detects terahertz waves includes a semiconductor layer that has a gain of the generated or detected terahertz waves; a first electrode connected to the semiconductor layer; a second electrode that is arranged at a side opposite to the side at which the first electrode is arranged with respect to the semiconductor layer and that is electrically connected to the semiconductor layer; a third electrode electrically connected to the second electrode; and a dielectric layer that is arranged around the semiconductor layer and the second electrode and between the first electrode and the third electrode and that is thicker than the semiconductor layer. The dielectric layer includes (Continued)

an area including a conductor electrically connecting the second electrode to the third electrode. The area is filled with the conductor.

16 Claims, 6 Drawing Sheets

(51) Int. Cl.
| | |
|---|---|
| H03K 3/315 | (2006.01) |
| H01Q 9/04 | (2006.01) |
| H01L 31/08 | (2006.01) |
| H01L 31/0304 | (2006.01) |
| H01L 31/0352 | (2006.01) |
| H01L 31/108 | (2006.01) |
| H01L 31/02 | (2006.01) |
| H01L 31/0224 | (2006.01) |
| H01L 31/0232 | (2014.01) |
| H01P 3/08 | (2006.01) |
| H01Q 1/22 | (2006.01) |
| H01S 5/10 | (2021.01) |
| H01S 5/34 | (2006.01) |
| H01S 5/022 | (2021.01) |
| H01S 5/042 | (2006.01) |

(52) U.S. Cl.
CPC .......... *H01L 31/022408* (2013.01); *H01L 31/03046* (2013.01); *H01L 31/035236* (2013.01); *H01L 31/08* (2013.01); *H01L 31/108* (2013.01); *H01P 3/08* (2013.01); *H01Q 1/2283* (2013.01); *H01Q 9/0407* (2013.01); *H01Q 9/0414* (2013.01); *H01Q 9/0442* (2013.01); *H01S 5/1028* (2013.01); *H01S 5/3402* (2013.01); *H03B 7/14* (2013.01); *H01Q 9/0471* (2013.01); *H01S 5/02268* (2013.01); *H01S 5/04252* (2019.08); *H01S 2302/02* (2013.01); *H03B 2200/0044* (2013.01); *H03B 2200/0084* (2013.01)

(58) Field of Classification Search
CPC .. H01Q 9/0407; H01Q 1/2283; H01Q 9/0442; H01Q 9/0471; H01L 31/02327; H01L 31/02005; H01L 31/022408; H01L 31/08; H01L 31/03046; H01L 31/035236; H01L 31/108; H01S 5/1028; H01S 5/3402; H01S 2302/02; H01S 5/02268; H01S 5/0425; H01S 5/04252; H01P 3/08
USPC ...................................................... 331/107 T
See application file for complete search history.

(56) References Cited

U.S. PATENT DOCUMENTS

| | | | |
|---|---|---|---|
| 2006/0055476 | A1 | 3/2006 | Kazakov |
| 2007/0279143 | A1* | 12/2007 | Itsuji ................. H01Q 1/38 331/185 |
| 2010/0244994 | A1 | 9/2010 | Sekiguchi |
| 2016/0344343 | A1* | 11/2016 | Feiginov ............ H03B 7/08 |
| 2017/0271774 | A1* | 9/2017 | Mukai ................ H01Q 9/16 |

FOREIGN PATENT DOCUMENTS

| | | |
|---|---|---|
| JP | 2012-104772 A | 5/2012 |
| JP | 2014-517620 A | 7/2014 |
| JP | 2015-091117 A | 5/2015 |
| WO | 2014/148343 A1 | 9/2014 |

* cited by examiner

[Fig. 1A]
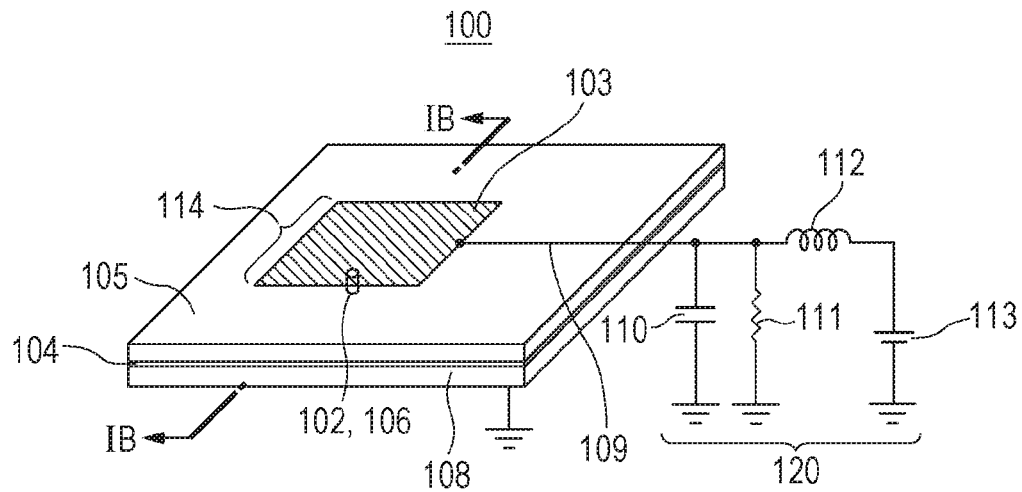
[Fig. 1B]
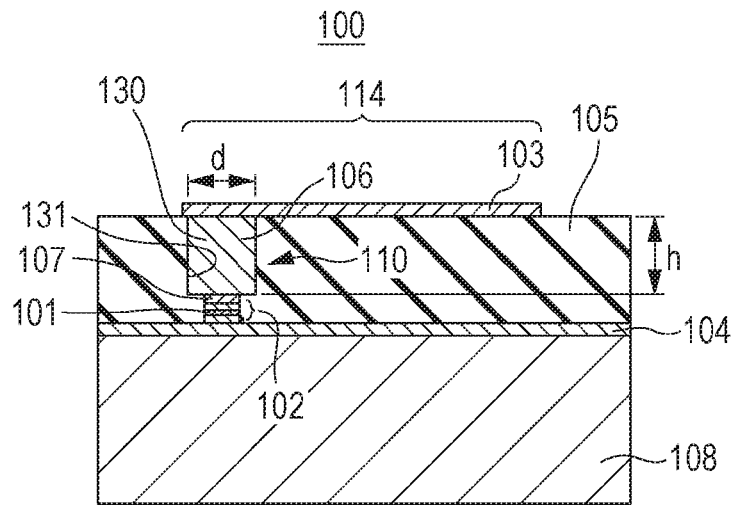
[Fig. 1C]
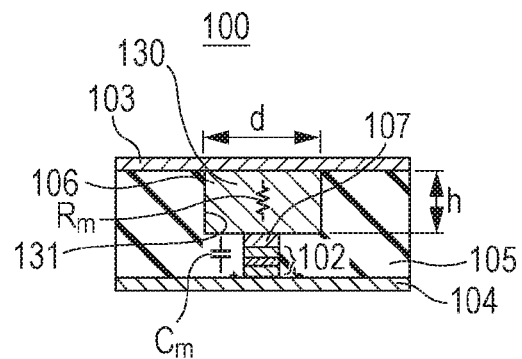

[Fig. 2A]
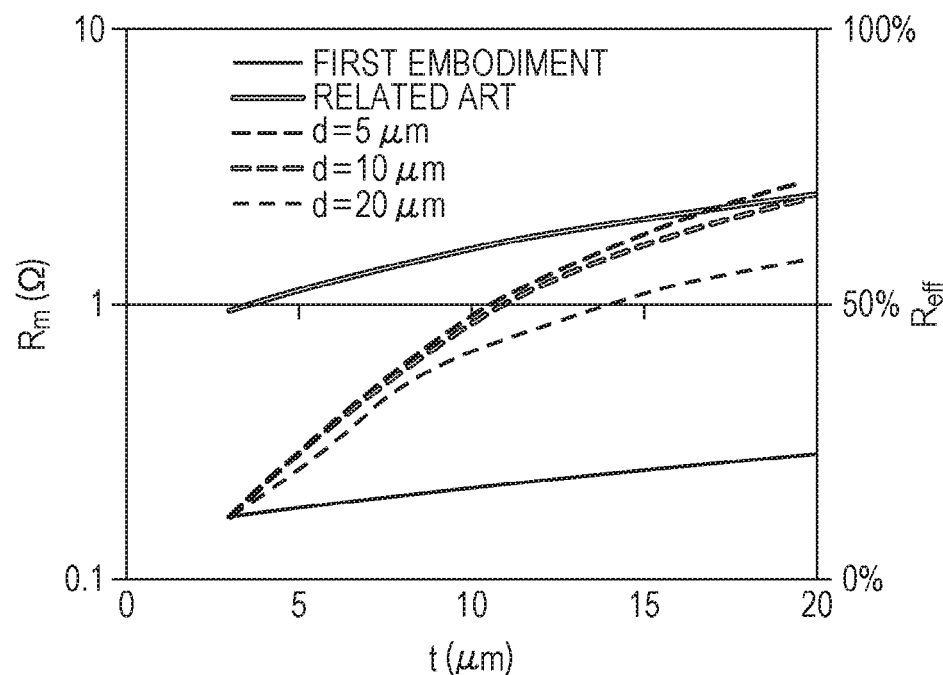
[Fig. 2B]
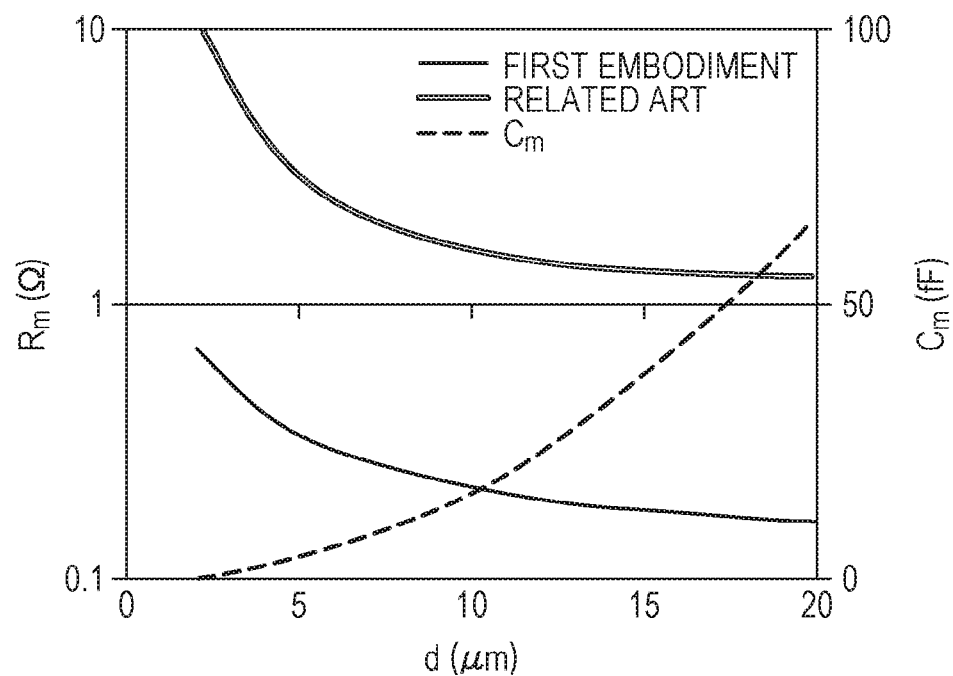

[Fig. 3A]
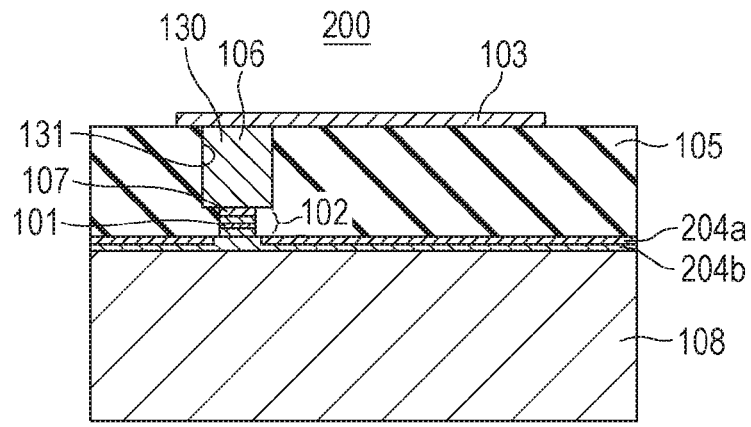
[Fig. 3B]
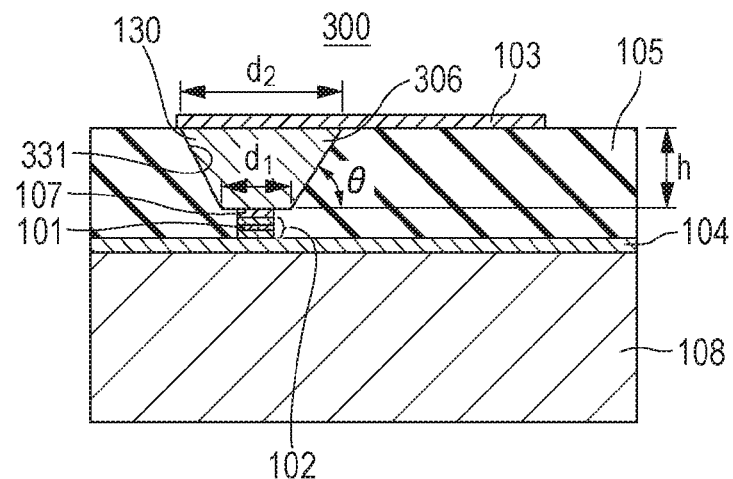
[Fig. 3C]
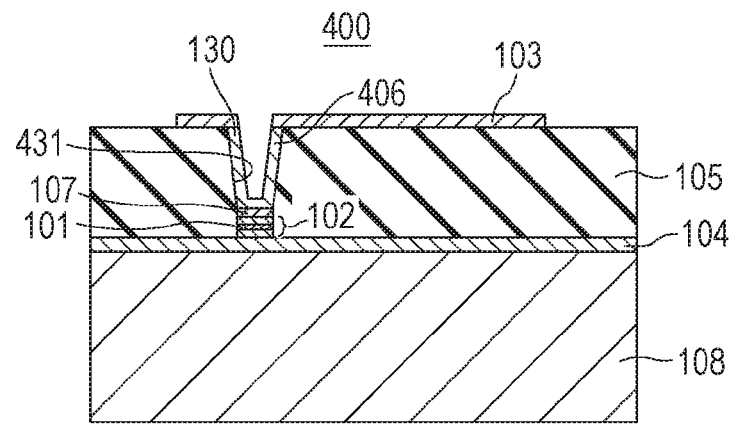

[Fig. 4A]
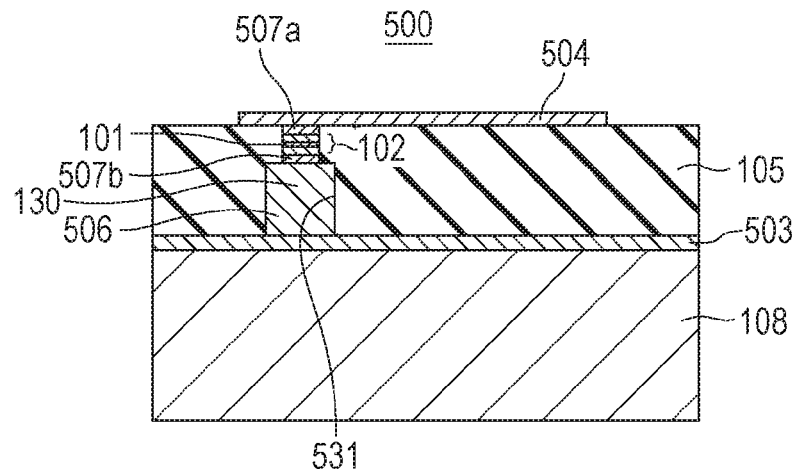
[Fig. 4B]
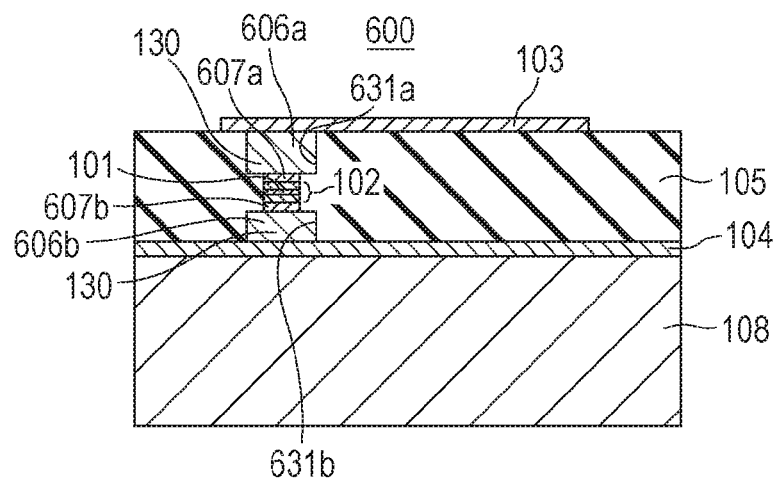
[Fig. 4C]
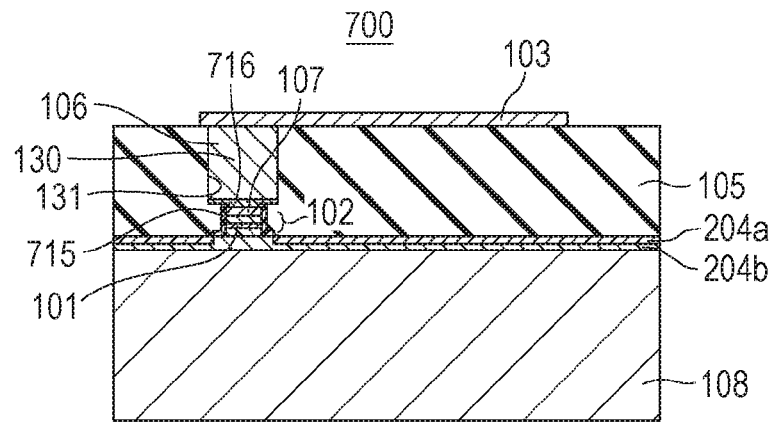

[Fig. 5]
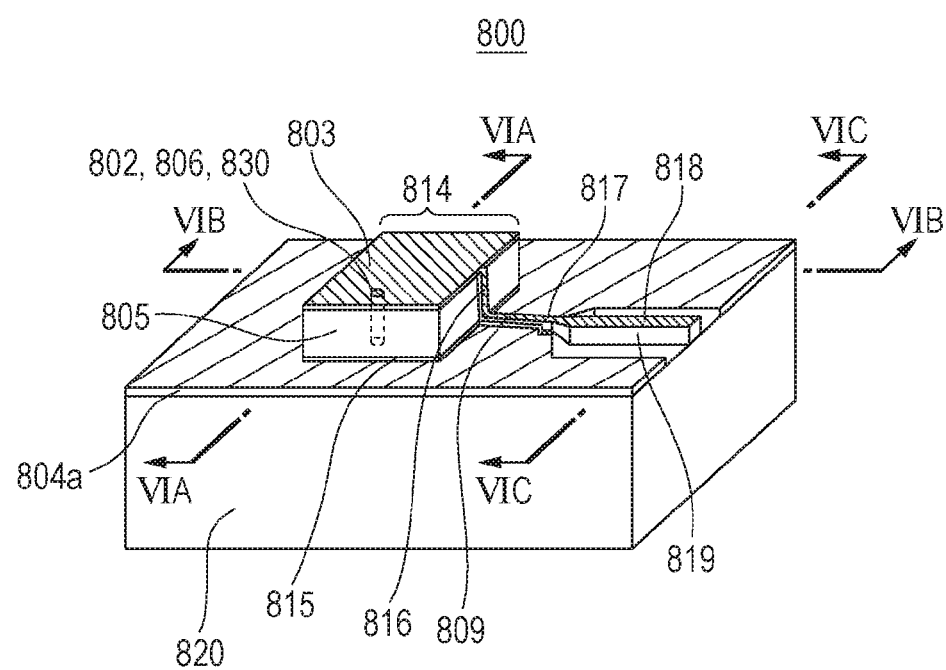

[Fig. 6A]
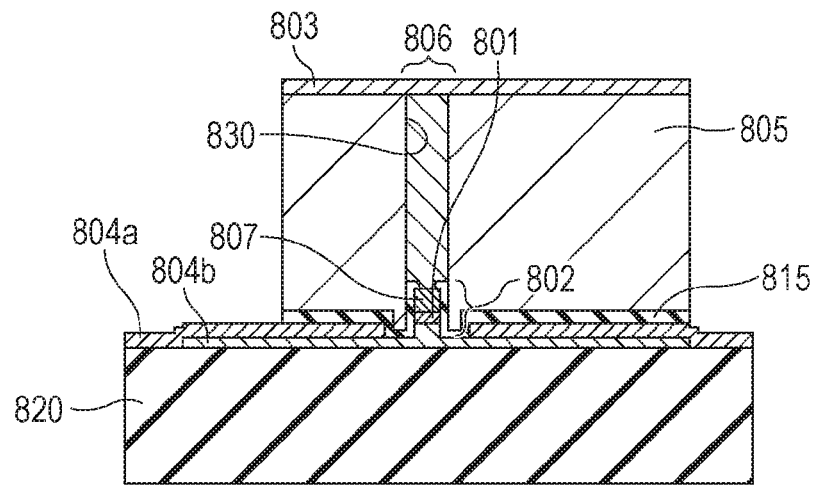
[Fig. 6B]
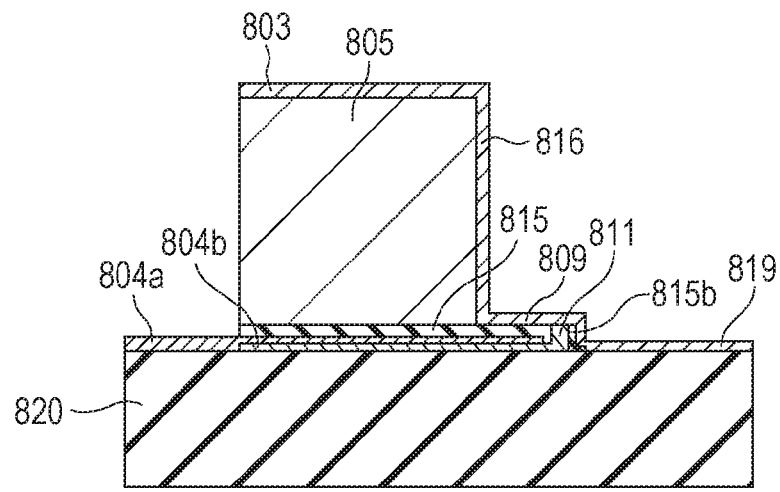
[Fig. 6C]
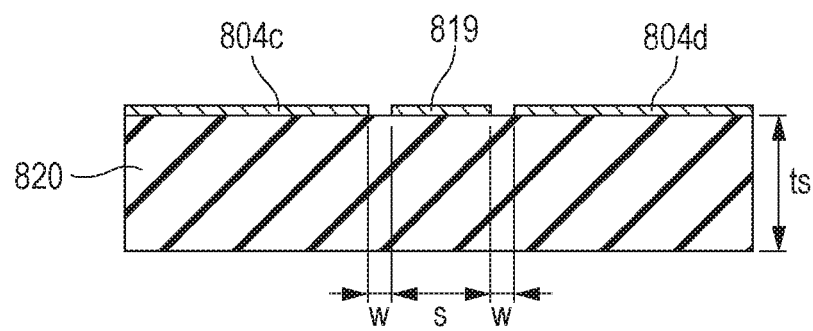

SEMICONDUCTOR DEVICE

TECHNICAL FIELD

The present invention relates to a semiconductor device that uses a resonant tunneling diode and that generates or detects terahertz waves.

BACKGROUND ART

Some oscillators use semiconductor devices as light sources adopting an electric current injection method, which generate electromagnetic waves (hereinafter referred to as "terahertz waves") of a frequency domain from 30 GHz to 30 THz. A device having a gain in the frequency domain of the terahertz band and a resonator are integrated in each semiconductor device. In particular, in some oscillators, resonant tunneling diodes (RTDs) and resonators are integrated. The oscillators using the RTDs are expected as devices that operate at room temperature in a frequency domain near one terahertz (1 THz).

NPL 1 discloses a terahertz oscillator in which a slot antenna resonator formed in a planner shape on a semiconductor substrate and an RTD are integrated. A double barrier RTD is used in NPL 1. The double barrier RTD is composed of an InGaAs quantum well layer and an AlAs tunnel barrier layer, which are epitaxially grown on an InP substrate. In the oscillator using such an RTD, oscillation of the terahertz waves is realized at room temperature near a domain in which negative differential resistance is developed in voltage-current (V-I) characteristics. In addition, PTL 1 discloses a terahertz oscillator in which a double barrier RTD and a microstrip resonator are integrated on the same substrate.

CITATION LIST

Patent Literature

PTL 1: U.S. Patent No. 2006/0055476

Non Patent Literature

NPL 1: Japanese Journal of Applied Physics, Vol. 47, No. 6 (2008), pp. 4375 to 4384

SUMMARY OF INVENTION

The present invention provides a semiconductor device that generates or detects terahertz waves. The semiconductor device includes a semiconductor layer that has a gain of the generated or detected terahertz waves; a first electrode connected to the semiconductor layer; a second electrode that is arranged at a side opposite to the side at which the first electrode is arranged with respect to the semiconductor layer and that is electrically connected to the semiconductor layer; a third electrode electrically connected to the second electrode; and a dielectric layer that is arranged around the semiconductor layer and the second electrode and between the first electrode and the third electrode and that is thicker than the semiconductor layer. The dielectric layer includes an area including a conductor electrically connecting the second electrode to the third electrode. The area is filled with the conductor.

The present invention provides a semiconductor device that generates or detects terahertz waves. The semiconductor device includes a semiconductor layer that has a gain of the generated or detected terahertz waves; a first electrode connected to the semiconductor layer; a second electrode that is arranged at a side opposite to the side at which the first electrode is arranged with respect to the semiconductor layer and that is electrically connected to the semiconductor layer; a third electrode electrically connected to the second electrode; and a dielectric layer that is arranged around the semiconductor layer and the second electrode and between the first electrode and the third electrode and that is thicker than the semiconductor layer. The dielectric layer includes an area including a conductor electrically connecting the second electrode to the third electrode. The area has a shape meeting the following Equation:

$$\tan \theta = (d_2 - d_1)/2h$$

$$45° < \theta < 135°$$

wherein $d_1$ denotes a width of a face of the area at the second electrode side, $d_2$ denotes a width of a face of the area at the third electrode side, and h denotes a thickness of the area.

Further features of the present invention will become apparent from the following description of exemplary embodiments with reference to the attached drawings.

BRIEF DESCRIPTION OF DRAWINGS

FIG. 1A is a prospective view for describing an exemplary configuration of a semiconductor device of a first embodiment.

FIG. 1B is a cross-sectional view taken along IB-IB for describing the configuration of the semiconductor device of the first embodiment.

FIG. 1C is a diagram for describing a semiconductor layer and an area in the semiconductor device of the first embodiment.

FIG. 2A is a graph illustrating an exemplary result of analysis in a case in which the thickness of a dielectric layer in the semiconductor device of the first embodiment is varied.

FIG. 2B is a graph illustrating an exemplary result of analysis in a case in which the width of the area in the semiconductor device of the first embodiment is varied.

FIG. 3A is a diagram for describing an exemplary configuration of a semiconductor device of a second embodiment.

FIG. 3B is a diagram for describing another exemplary configuration of the semiconductor device of the second embodiment.

FIG. 3C is a diagram for describing another exemplary configuration of the semiconductor device of the second embodiment.

FIG. 4A is a diagram for describing another exemplary configuration of the semiconductor device of the second embodiment.

FIG. 4B is a diagram for describing another exemplary configuration of the semiconductor device of the second embodiment.

FIG. 4C is a diagram for describing another exemplary configuration of the semiconductor device of the second embodiment.

FIG. 5 is a diagram for describing an exemplary configuration of a semiconductor device of Example 2.

FIG. 6A is a cross-sectional view taken along VIA-VIA for describing the configuration of the semiconductor device of Example 2.

FIG. 6B is a cross-sectional view taken along VIB-VIB for describing the configuration of the semiconductor device of Example 2.

FIG. 6C is a cross-sectional view taken along VIC-VIC for describing the configuration of the semiconductor device of Example 2.

DESCRIPTION OF EMBODIMENTS

Series resistance $R_m$ caused by the structure of a semiconductor layer including an RTD may cause loss of electromagnetic waves and RC delay. A typical oscillator using a microstrip resonator, such as a patch antenna, is capable of improving radiation efficiency by increasing the thickness of a dielectric. Accordingly, a trade-off is made between the thickness of the dielectric and the thickness of the semiconductor in the microstrip resonator in related art and the improvement of the radiation efficiency is restricted. In order to resolve such a problem, PTL 1 discloses a configuration using a substrate as a dielectric of a resonator. However, the material of the dielectric available for the substrate is limited and yield may be reduced because the thickness of the substrate is decreased in the terahertz band.

In order to resolve the above problems, in the following embodiments and examples, it is desirable to provide semiconductor devices capable of reducing the loss of the electromagnetic waves in terahertz oscillators using devices, such as RTDs, which have gains in the frequency domain of the terahertz waves, compared with the related art, to generate or detect the terahertz waves more efficiently.

First Embodiment

A semiconductor device 100 (hereinafter referred to as a "device 100") according to a first embodiment will now be described. The device 100 generates or detects the terahertz waves of a frequency (resonant frequency) $f_{THz}$. FIG. 1A is a prospective view illustrating an exemplary appearance of the device 100. FIG. 1B is a cross-sectional view taken along IB-IB and FIG. 1C is a diagram for describing a semiconductor layer and an area, An example is described here in which the device 100 is used as an oscillator.

The configuration of the device 100 will be first described. The device 100 includes a resonator 114 for the electromagnetic waves in the terahertz band and a bias circuit 120. The resonator 114 includes a first electrode 104, a semiconductor layer 102, a second electrode 107, a dielectric layer 105, and a third electrode 103. The dielectric layer 105 includes an area 106 including a conductor 130. The semiconductor layer 102 includes a resonant tunneling diode (RTD) 101. The length of each component in the stacking direction of the third electrode 103, the first electrode 104, the second electrode 107, and the semiconductor layer 102 is referred to as thickness or height, and the length of each component in a direction (resonance direction) of the resonance of the electromagnetic waves with the resonator 114 on a plane perpendicular to the stacking direction is referred to width in the following description.

The resonator 114 is a terahertz resonator. In the resonator 114, the first electrode 104, the semiconductor layer 102, the second electrode 107, the conductor 130, and the third electrode 103 are stacked in this order. The resonator 114 has a configuration in which the dielectric layer 105 is sandwiched between the two conductors: the third electrode 103 and the first electrode 104. Such a configuration is well known as a microstrip resonator using, for example, a microstrip line having a finite length.

The first electrode 104 is arranged on a substrate 108. The semiconductor layer 102 including the RTD 101 is arranged on the first electrode 104 and is connected to the first electrode 104.

The RTD 101 has a resonant tunneling layer including multiple tunnel barrier layers, and a quantum well layer is provided between the multiple tunnel barrier layers. In other words, the RTD 101 has a multi-quantum well structure in which the terahertz waves are generated through transition between subbands of carrier waves and has an electromagnetic gain in the frequency domain of the terahertz waves. The terahertz waves are electromagnetic waves in a frequency domain from 30 GHz to 30 THz. The RTD 101 has the gain in the frequency domain of the terahertz waves based on photon assisted tunneling in a negative differential resistance region. A quantum cascade laser (QCL) having a semiconductor multi-layer structure in which several hundred layers to several thousand layers are stacked may be used as a structure having the gain in the frequency domain of the terahertz waves. In this case, the semiconductor layer 102 includes the QCL.

The second electrode 107 is arranged at a side opposite to the side at which the first electrode 104 is arranged with respect to the semiconductor layer 102. The second electrode 107 is electrically connected to the semiconductor layer 102. The second electrode 107 of the first embodiment is an ohmic electrode ohmically connected to the semiconductor layer 102 and is preferred for reduction in the series resistance described below. The second electrode 107 may be hereinafter referred to as an ohmic electrode 107.

The ohmic electrode 107 is not limited to have the above configuration. The ohmic electrode 107 may be used in part of the first electrode 104, that is, in an area in contact with the semiconductor layer 102 of the first electrode 104. The second electrode 107 is preferably made of, for example, Mo, Ti/Pd/Au, Ti/Pt/Au, AuGe/Ni/Au, TiW, or ErAs. Use of the second electrode 107 having an area which is in contact with the semiconductor layer 102 and in which impurity is heavily doped is preferred for high output power and high frequency because the contact resistance is further reduced in this case. Alternatively, the second electrode 107 may have a contact configuration, such as Schottky contact, exhibiting rectification with the semiconductor layer 102. An example is described in the first embodiment in which the second electrode 107 is an ohmic electrode.

The dielectric layer 105 is arranged around the semiconductor layer 102 and the second electrode 107. The semiconductor layer 102 and the second electrode 107 are embedded in the dielectric layer 105. A thickness t of the dielectric layer 105 is at least greater than the thickness of the semiconductor layer 102. The dielectric used as the dielectric layer 105 is a substance more excellent in dielectric property than in conductivity property and is a material that behaves as an insulating material or a high-resistance material blocking direct-current voltage. Typically, a material having resistivity of $1 \times 10^3$ Ω-m (ohm-meter) or more is preferably used for the dielectric layer 105. Specifically, the dielectric layer 105 may be made of, for example, plastics, ceramics, silicon oxide, or silicon nitride.

The third electrode 103 is arranged so as to oppose the first electrode 104 via the dielectric layer 105 and is electrically connected to the ohmic electrode 107 via the area 106.

The area 106 has a structure electrically connecting the second electrode 107 to the third electrode 103 and includes the conductor 130. The structure electrically connecting upper and lower layers, like the area 106, is generally called a via. Such a structure causes each of the first electrode 104 and the third electrode 103 to also function as an electrode for injecting current into the RTD 101.

The area 106 is included in a cavity (via hole) 131 formed in the dielectric layer 105. Specifically, the area 106 is filled with the conductor 130 or includes the conductor 130 with which the surfaces of arbitrary layers formed in the dielectric layer 105 or the cavity 131 are covered. This forms a via ensuring electrical continuity between the multiple electrode layers formed in the thickness direction of the dielectric layer 105. For example, the area 106 of the first embodiment ensures the electrical continuity between the ohmic electrode 107 and the third electrode 103 via the conductor 130 in the area 106.

The conductor 130 is made of a material having resistivity of $1\times10^{-6}$ Ω-m or less. Specifically, a metal, such as Ag, Au, Cu, W, Ni, Cr, Ti, Al, AuIn alloy, or TiN, or a metal compound is preferably used for the conductor 130.

A patch antenna, which is a typical terahertz resonator, is used as the resonator 114 in the first embodiment. The resonator 114 is set so that the width in the IB-IB direction (resonance direction) of the third electrode 103, which is a patch conductor, corresponds to a $\lambda/2$ resonator. The first electrode 104, which is a ground conductor, is grounded. Here, $\lambda$ denotes an effective wavelength in the dielectric layer 105 of the resonating terahertz waves in the resonator 114. $\lambda=\lambda_0\times\varepsilon_r^{-1/2}$ where $\lambda_0$ denotes the wavelength of the terahertz waves in vacuum and $\varepsilon_r$ denotes the relative dielectric constant of the dielectric layer 105.

The resonator 114 is an active antenna in which the patch antenna including the RTD 101 is integrated. Accordingly, the frequency $f_{THz}$ of the terahertz waves oscillated from the device 100 is determined to be the resonant frequency of a fully-parallel resonant circuit in which the reactance of the resonator 114 is combined with the reactance of the semiconductor layer 102. Specifically, a frequency meeting an amplitude condition in (1) and a phase condition (2) in a resonant circuit in which the admittance ($Y_{RTD}$) of the RTD and the admittance ($Y_{ANT}$) of the antenna are combined is determined to be the oscillation frequency $f_{THz}$ from the equivalent circuit of the oscillator described in NPL 1.

$$\text{Re}[Y_{RTD}]+\text{Re}[Y_{ANT}] \text{ is smaller than or equal to zero} \quad (1)$$

$$\text{Im}[Y_{RTD}]+\text{Im}[Y_{ANT}] \text{ is equal to zero} \quad (2)$$

where $\text{Re}[Y_{RTD}]$ denotes the admittance of the semiconductor layer 102 and has a negative value.

The resonator 114 is connected to the bias circuit 120 via a line 109. The bias circuit 120 is a circuit for supplying bias voltage to the RTD 101. The line 109 desirably has a size that does not interfere with the resonant electric field in the resonator 114 and, for example, preferably has a size of $\frac{1}{10}$ of the effective wavelength $\lambda$ or less ($\lambda/10$ or less). The line 109 is preferably arranged at a node of the electric field of the terahertz waves of the oscillation frequency $f_{THz}$, which stands in the resonator 114. Here, the line 109 has a configuration in which the impedance of the line 109 is higher than the absolute value of the negative differential resistance of the RTD 101 in the frequency band near the oscillation frequency $f_{THz}$. With this configuration, the interference of the oscillation frequency $f_{THz}$ in the resonator 114 with the electric field is suppressed.

The "node of the electric field of the terahertz waves of the oscillation frequency $f_{THz}$, which stands in the resonator" means an area that corresponds to a practical node of the electric field of the terahertz waves of the oscillation frequency $f_{THz}$, which stands in the resonator. Specifically, the "node of the electric field of the terahertz waves of the oscillation frequency $f_{THz}$, which stands in the resonator" corresponds to an area in which the strength of the electric field of the terahertz waves of the oscillation frequency $f_{THz}$, which stands in the resonator, is an order of magnitude smaller than the maximum strength of the electric field of the terahertz waves of the oscillation frequency $f_{THz}$, which stands in the resonator. The area is preferably at a position where the strength of the electric field of the terahertz waves of the oscillation frequency $f_{THz}$ is smaller than or equal to $1/e^2$ (e is the base of natural logarithm) of the maximum strength of the electric field of the terahertz waves of the oscillation frequency $f_{THz}$, which stands in the resonator.

The bias circuit 120 for supplying the bias voltage to the RTD 101 includes a resistor 111 connected in parallel to the RTD 101, a capacitor 110 connected in parallel to the resistor 111, a power supply 113, and wiring 112. Since the wiring 112 constantly includes a parasitic inductance component, the wiring 112 is illustrated as an inductance in FIG. 1A. The power supply 113 supplies current necessary to drive the RTD 101 to adjust the bias voltage. The bias voltage is typically selected from the negative differential resistance region of the RTD 101. The bias voltage from the bias circuit 120 is supplied to the device 100 through the line 109.

The resistor 111 and the capacitor 110 in the bias circuit 120 suppress parasitic oscillation of the relative low resonant frequency (typically, a frequency band from direct current (DC) to 100 GHz) caused by the bias circuit 120. A value that is equal to or slightly smaller than the absolute value of the negative differential resistance in the negative differential resistance region of the RTD 101 is preferably selected as the value of the resistor 111.

The capacitor 110 is preferably set so as to have impedance that is equal to or slightly smaller than the absolute value of the negative differential resistance of the RTD 101, as in the resistor 111. In general, the capacitor 110 is preferably has a higher value within the above range and is set to about several ten picofarads (pF) in the first embodiment. The capacitor 110 is a decoupling capacitor. For example, a metal-insulator-metal (MIM) structure in which the capacitor 110 uses the same substrate as that of the resonator 114, which is a patch antenna, may be used.

It is generally known that the conductor loss is reduced and the radiation efficiency is improved by increasing the thickness of the dielectric layer in the microstrip resonator, such as a patch antenna. In contrast, the series resistance $R_m$ caused by the structure of the semiconductor layer including the RTD may cause, for example, the loss of the electromagnetic waves and the RC delay. Accordingly, a trade-off is made between the thickness of the dielectric layer and the thickness of the semiconductor layer in the microstrip resonator in the related art and the improvement of the radiation efficiency is restricted.

In the first embodiment, the resonator 114 has the configuration in which the first electrode 104, the semiconductor layer 102 including the RTD 101, the second electrode 107, the conductor 130 with which the area 106 is filled, and the third electrode 103 are stacked in this order. The device 100 has a configuration in which the radiation efficiency is capable of begin adjusted by varying the thickness t of the dielectric layer 105 in the resonator 114 through the adjustment of a height h of the area 106 serving as a via. The height h of the area 106 is capable of being mainly adjusted by varying the height of the cavity 131 formed in the dielectric layer 105. At this time, since the series resistance is capable being set to a relative low value by using the area 106 including the conductor 130 having a low resistivity in the device 100, the problem of the trade-off between the thickness of the dielectric layer 105 and the thickness of the semiconductor layer 102 involved in the radiation efficiency described above is relieved.

FIG. 2A is a graph illustrating an exemplary result of analysis of the structure dependence of the series resistance $R_m$ caused by the structure of the semiconductor layer 102, parasitic capacitance $C_m$ of the resonator 114, and radiation efficiency $R_{eff}$ in the configuration of the device 100 having an oscillation frequency of 0.45 THz disclosed in examples described below. The configuration of the device 100 used in the analysis will be described in the examples described below.

FIG. 2A illustrates an exemplary result of analysis of the dependence of the series resistance $R_m$ and the radiation efficiency $R_{eff}$ of the device 100 on the thickness of the dielectric layer. Specifically, FIG. 2A illustrates an exemplary result of analysis involved in the series resistance $R_m$ and the radiation efficiency $R_{eff}$ in a case in which the height h and a width d of the area 106 are varied to adjust the thickness of the dielectric layer in the device 100, which includes the area 106 including the conductor 130 having resistivity on the order of $10^{-8}$ Ω-m. As for the radiation efficiency $R_{eff}$, the dependence of the area 106 on the width d (d=5 μm, 10 μm, and 20 μm) is also illustrated in FIG. 2A. Referring to FIG. 2A, solid lines illustrate the series resistance $R_m$ and dotted lines illustrate the radiation efficiency $R_{eff}$. Here, the series resistance $R_m$ is a resistance mainly caused by the structure of the semiconductor layer 102 and the third electrode 103, the first electrode 104, and the second electrode 107 around the semiconductor layer 102 and is mainly estimated from a skin depth and spreading resistance. The series resistance $R_m$ is also illustrated in FIG. 2A as an example in the related art in a case in which the height and the width of a mesa-shaped semiconductor layer composed of semiconductor having resistivity on the order of $10^{-6}$ Ω-m are varied to adjust the thickness of the dielectric layer.

Since the absolute value of the negative resistance indicating the gain of the RTD 101 used in the terahertz band is on the order of about from 1Ω to 100Ω, it is necessary to reduce the loss of the electromagnetic waves to 1% or less of the absolute value of the negative resistance. Accordingly, it is necessary to decrease the series resistance $R_m$ to at least 1Ω or less. In addition, in order to operate the device 100 in the terahertz band, the width of the semiconductor layer 102 (approximately equal to the width of ohmic electrode 107) has a typical value of 0.1 μm to 5 μm. Accordingly, it is necessary to reduce contact resistance Rc, which is another factor of the series resistance, to a range from 0.1Ω to several ohms by setting contact resistivity to 10 Ω-μm² or less. Also from this point of view, the series resistance $R_m$ should be decreased to a value of 1Ω or less.

Referring to FIG. 2A, in the oscillator in the related art, when the thickness t of the dielectric layer 105 is adjusted by varying the thickness of the semiconductor layer 102, the series resistance $R_m$ exceeds 1Ω if the thickness of the dielectric layer 105 is greater than or equal to 3 μm. Accordingly, the loss and/or the delay caused by the series resistance $R_m$ become too large to ignore and it is not easy to improve the radiation efficiency. In contrast, in the case of the device 100 including the area 106 in the first embodiment, it is possible to reduce the increase in the series resistance $R_m$ associated with the increase in the thickness t of the dielectric layer 105 to the order of 0.1Ω. Accordingly, the radiation efficiency $R_{eff}$, which has been around 10%, is capable of being improved to about 50% or more by increasing the thickness t of the dielectric layer 105 in the resonator 114. Although the radiation efficiency is improved with the increasing thickness t of the dielectric layer 105, multi-mode resonance may occur if the dielectric layer 105 is too thick. Accordingly, it is preferred that the dielectric layer 105 be designed to have a thickness in a range from the thickness of the semiconductor layer 102 to λ/10.

The height of the semiconductor layer 102 is sufficiently thinner than the thickness t of the dielectric layer 105. Accordingly, the height h of the area 106 is preferably designed to have a thickness of λ/10 or less, as in the thickness t of the dielectric layer 105. A lower limit of the height h of the area 106 is preferably greater than or equal to the thickness of the third electrode 103 and is more preferably thicker than or equal to the thickness of the semiconductor layer 102.

FIG. 2B is a graph illustrating an exemplary result of analysis of the dependence of the series resistance $R_m$ and the parasitic capacitance $C_m$ on the width of the area 106 when the thickness t of the dielectric layer 105 is fixed to 10 μm in the device 100 in the examples. The semiconductor layer 102 is designed to have a thickness of 100 nm in order to decrease the series resistance $R_m$. Accordingly, the height h of the area 106 may be considered to be approximately equal to the thickness t of the dielectric layer 105.

Referring to FIG. 2B, the series resistance $R_m$ is decreased with the increasing width d of the area 106 while the parasitic capacitance $C_m$ (refer to FIG. 1C) parasitically occurring in a portion between the first electrode 104 and the area 106 is increased with the increasing width d of the area 106. Since the parasitic capacitance $C_m$ may cause the RC delay (RC time constant), the parasitic capacitance $C_m$ suppresses the high output power and the high frequency of the device 100. Accordingly, it is necessary to make the RC delay shorter than the period of the resonating electromagnetic waves. Since capacitance $C_d$ of the RTD 101 generally used in the terahertz band is around 100 fF, it is necessary to suppress the parasitic capacitance $C_m$ to at least 10% or less of the capacitance $C_d$ of the RTD 101.

The radiation efficiency is reduced with the increasing width d of the area 106 because the conductor loss is increased in response to the increase in the width d of the area 106, as illustrated in FIG. 2A. Accordingly, it is necessary to increase the width d of the area 106 in order to decrease the series resistance $R_m$. However, the width d of the area 106 should not be too large in consideration of the parasitic capacitance $C_m$ and the radiation efficiency $R_{eff}$. Consequently, the width d of the area 106 desirably has a size that does not interfere with the resonant electric field and is typically preferably set to a value of λ/10 or less. Since the series resistance $R_m$ is capable of being suppressed without extremely increasing the width d of the area 106 in the device 100, the effect of decreasing the series resistance $R_m$ due to the increase in the parasitic capacitance $C_m$ and the decrease in the radiation efficiency $R_{eff}$ caused by the width d of the area 106 may be small.

In addition, the width d of the area 106 is capable of being decreased to an extent that does not increase the series resistance and is estimated to be decreased to around two times of the skin depth. Accordingly, the width d may be decreased to an extent that does not cause the series resistance $R_m$ to exceed 1Ω and the width d of the area 106 may be smaller than the width of the semiconductor layer 102 within the above range. In this case, the width d of the area 106 is typically estimated to be in a range from 0.1 μm to 20 μm in terms of the radiation efficiency, the series resistance, and the parasitic capacitance although the width d of the area 106 is varied depending on the structure of the capacitor 110 and the oscillation frequency.

With the resonator 114, adjusting the thickness t and the material of the dielectric layer 105 allows the characteristic impedance of the resonator 114 to be adjusted. It is common knowledge that the characteristic impedance of the microstrip resonator is increased with the increasing thickness t of the dielectric layer 105 and is decreased with the decreasing thickness t of the dielectric layer 105. The thickness t of the dielectric layer 105 is typically designed to be sufficiently thinner than the wavelength of the electromagnetic waves. It is also common knowledge that the characteristic impedance is increased with the decreasing dielectric constant of the material of the dielectric layer 105 and is decreased with the increasing dielectric constant of the material of the dielectric layer 105. The resonator 114 of the first embodiment has a configuration in which the material and the thickness of the dielectric layer 105 are capable of being selected so as to achieve impedance matching with the RTD 101.

The example in which the device 100 is mainly used as an oscillator is described above. As another example, the device 100 may be caused to operate as a detector of the terahertz waves using a portion in current-voltage characteristics of the RTD 101, where nonlinearity of current occurs with variation in voltage.

As described above, according to the first embodiment, the radiation efficiency is capable of being improved by reducing the conductor loss and achieving the impedance matching through the adjustment of the dielectric thickness. Accordingly, the semiconductor device is provided, which is capable of reducing the loss of the electromagnetic waves in the terahertz resonator in which the RTD is integrated, compared with the related art, to generate or detect the terahertz waves more efficiently.

Second Embodiment

Multiple semiconductor devices will be described in a second embodiment as modifications of the device 100 of the first embodiment. Each semiconductor device of the second embodiment is capable of being used as an oscillator that generates the terahertz waves or a detector that detects the terahertz waves.

FIG. 3A to FIG. 3C are diagrams for describing exemplary configurations of semiconductor devices 200, 300, and 400, which are modifications of the device 100. The same reference numerals are used in the semiconductor devices 200, 300, and 400 to identify the same components in the device 100. A detailed description of such components is omitted herein.

The semiconductor device 200 illustrated in FIG. 3A uses a metal layer 204a and a semiconductor layer 204b in which impurity is heavily doped as the first electrode 104. The remaining configuration of the semiconductor device 200 is the same as that in the first embodiment and the semiconductor layer 102 is epitaxially grown on the substrate 108. With the semiconductor device 200, it is possible to reduce the loss of the electromagnetic waves, compared with the related art, to generate or detect the terahertz waves more efficiently. In addition, since the semiconductor device 200 uses a substrate resulting from epitaxial growth of the semiconductor layer 102 including the RTD 101 as the substrate 108, the semiconductor device 200 has a useful configuration.

The semiconductor device 300 illustrated in FIG. 3B uses an area 306 in which an inverse tapered shape cavity 331 formed in the dielectric layer 105 is filled with metal as the area 106. With this configuration, the series resistance $R_m$ and the parasitic capacitance $C_m$ are further decreased. In this case, a width $d_2$ of a face of the area 306 at the third electrode 103 side desirably has a size that does not interfere with the resonant electric field in terms of the radiation efficiency and is preferably set to, for example, a value of $\lambda/10$ or less. Since the thickness t of the dielectric layer 105 is designed to be in the range of $\lambda/10$ or less, as described above, the height h of the area 306 is also designed to be in a similar range.

Since increase in the width $d_2$ of the area 306 presents a problem in terms of the radiation efficiency, an angle θ of the tapered shape is desirably designed to have a value greater than or equal to 45° in order to suppress the increase in the width $d_2$ caused by the increase in the height h of the area 306. The taper angle θ is defined as tan θ=$2h/(d_2-d_1)$ where the width of the face of the area 306 at the second electrode 107 side is denoted by $d_1$. If the taper angle θ is greater than or equal to 60°, the aspect ratio of the area 306 is further increased. Accordingly, the configuration in FIG. 3B is more preferable because the increase in the width of the area 306 is suppressed even if the dielectric layer 105 is made thick. In addition, in terms of the aspect ratio of the area 306, the width $d_2$ of the face of the area 306 at the third electrode 103 side is preferably at least 20 times greater than a width $d_1$ of the face of the area 306 at the ohmic electrode 107 side or less and is more preferably set to a value 10 times greater than the width $d_1$ of the face of the area 306 at the ohmic electrode 107 side or less.

The shape of the area 306 may be a tapered shape in which the width $d_2$ is smaller than the width $d_1$ and, in terms of the parasitic capacitance $C_m$ and the conductor loss described above, the taper angle θ may have a value of up to about 135°. However, the taper angle θ desirably has a value of 90° or more, that is, the width $d_2$ is desirably greater than or equal to the width $d_1$ because the resistance is increased when the width of the area 306 is small. The width of the area 306 is set to a value of $\lambda/10$ or less in a portion where the area 306 has the greatest width regardless of the shape of the area 306.

With the semiconductor device 300 described above, it is possible to reduce the loss of the electromagnetic waves, compared with the related art, to generate or detect the terahertz waves more efficiently.

FIG. 3C illustrates an exemplary configuration of the semiconductor device 400. The semiconductor device 400 includes an area 406 as the area 106. The area 406 has a hollow electrode structure in which the surface of a cavity 431 having the taper angle θ is coated with the thin film of the conductor 130. It is sufficient for the area 406 to have a configuration in which the surface of the cavity 431 formed in the dielectric layer 105 is coated with the conductor 130, and the area 406 may have a configuration in which the area 406 is not completely filled with the conductor 130 and is partially hollowed. In this case, in terms of the series resistance, the thickness of the conductor 130 is preferably two times greater than the skin depth or more. A process of embedding metal is not required in such a configuration, the semiconductor device 400 has a large yield and a reduced manufacturing cost.

Also in such a configuration, the width of the area 406 is set to a value of $\lambda/10$ or less in a portion where the area 406 has the greatest width. In the area 406, for example, the taper angle is determined in a range similar to that in the semiconductor device 300 described above.

With the semiconductor device 400 described above, it is possible to reduce the loss of the electromagnetic waves, compared with the related art, to generate or detect the terahertz waves more efficiently.

FIG. 4A to FIG. 4C are diagrams for describing exemplary configurations of semiconductor devices 500, 600, and 700, which are other modifications of the device 100. The same reference numerals are used in the semiconductor devices 500, 600, and 700 to identify the same components in the device 100. A detailed description of such components is omitted herein.

FIG. 4A is a diagram for describing an exemplary configuration of the semiconductor device 500, which is one modification of the device 100. The semiconductor device 500 includes a resonator having a configuration in which a third electrode 503, an area 506 including the conductor 130 with which a cavity 531 is filled, a first ohmic electrode 507b, the semiconductor layer 102 including the RTD 101, a second ohmic electrode 507a, a first electrode 504 are stacked in this order.

In the device 100, the first electrode 104 is arranged at the substrate 108 side with respect to the third electrode 103 and the area 106 is provided at a side opposite to the side of the substrate 108 with respect to the semiconductor layer 102. In contrast, in the semiconductor device 500, the third electrode 503 is arranged at the substrate 108 side with respect to the first electrode 504 and the area 506 is provided at the substrate 108 side with reference to the semiconductor layer 102. The area 506 may have a configuration similar to that of the area 106 and the ohmic electrodes 507a and 507b may be the same as the ohmic electrode 107.

With the semiconductor device 500 described, above, it is possible to reduce the loss of the electromagnetic waves, compared with the related art, to generate or detect the terahertz waves more efficiently. The arrangement of the first ohmic electrode 507b between the area 506 and the semiconductor layer 102 is preferred because the series resistance is further decreased in this case.

FIG. 4B is a diagram for describing an exemplary configuration of the semiconductor device 600, which is one modification of the device 100. The semiconductor device 600 has a configuration in which the first electrode 104, an area 606b including the conductor 130 with which a cavity 631b is filled, an ohmic electrode 607b, the semiconductor layer 102, an ohmic electrode 607a, an area 606a including the conductor 130 with which a cavity 631a is filled, and the third electrode 103 are stacked in this order on the substrate 108. The configuration of each of the areas 606a and 606b, the semiconductor layer 102, and the ohmic electrodes 607a and 607b may be the same as that in the device 100. The size and the shape of the area 606b preferably meet the above relationship, where the width $d_1$ corresponds to a width $d_3$ of the area 606b at the ohmic electrode 607b side and the width $d_2$ corresponds to a width $d_4$ of the area 606b at the first electrode 104 side. With the semiconductor device 600 described above, it is possible to reduce the loss of the electromagnetic waves, compared with the related art, to generate or detect the terahertz waves more efficiently.

FIG. 4C is a diagram for describing an exemplary configuration of the semiconductor device 700, which is one modification of the device 100. In the semiconductor device 700, the semiconductor layer 102 and the ohmic electrode 107 in the semiconductor device 200 are covered with an insulating layer 715 made of silicon nitride or the like. The area 106 is connected to the ohmic electrode 107 via a contact hole 716 having a width of 1 μm or less, which is narrower than the width of the semiconductor layer 102. With the semiconductor device 700 described above, it is possible to reduce the loss of the electromagnetic waves, compared with the related art, to generate or detect the terahertz waves more efficiently.

As described above, with the semiconductor devices described in the second embodiment, it is possible to reduce the conductor loss and perform the impedance matching by adjusting the thickness of the dielectric. Accordingly, it is possible to reduce the loss of the electromagnetic waves in the oscillator including the terahertz resonator in which the RTD is integrated, compared with the related art, to generate or detect the terahertz waves more efficiently.

Example 1

An exemplary configuration of the device 100 generating the terahertz waves in Example 1 will now be described. The device 100 oscillates at the oscillation frequency $f_{THz}$=0.45 THz. The RTD 101 used in Example 1 has, for example, a multi-quantum well structure including InGaAs/InAlAs layers and InGaAs/AlAs layers on the InP substrate 108 and includes n-InGaAs contact layers.

For example, a triple barrier structure is used as the multi-quantum well structure. More specifically, a semiconductor multi-layer structure including AlAs (1.3 nm)/InGaAs (7.6 nm)/InAlAs (2.6 nm)/InGaAs (5.6 nm)/AlAs (1.3 nm) layers is used. Among the layers, the InGaAs layers are well layers and the lattice matched InAlAs layer and the non-matching AlAs layers are barrier layers. These layers are intentionally set as undoped layers in which carrier doping is not performed.

Such a multi-quantum well structure is sandwiched between the n-InGaAs contact layers having electron concentration of $2\times10^{18}$ cm$^{-3}$. The current-voltage (IV) characteristics of the structure between the contact layers has a peak current density of 280 kA/cm$^3$ and the negative differential resistance region from about 0.7 V to about 0.9 V. In the case of a mesa structure in which the RTD 101 has a diameter of about 2 μmΦ, the peak current of 110 mA and the negative differential resistance of −20Ω are achieved.

The resonator 114 includes the third electrode 103, which is a patch conductor; the first electrode 104, which is a ground conductor; the dielectric layer 105; and the semiconductor layer 102 including the RTD 101. The resonator 114 includes a square patch antenna in which the third electrode 103 has a side of 200 μm. BCB (benzocyclobutene, Dow Chemical Company, $\varepsilon_r$=2.4) having a thickness of 3 μm is arranged between the third electrode 103 and the first electrode 104 as the dielectric layer 105.

The first electrode 104 uses an n+-InGaAs layer (200 nm) having the electron concentration of $2\times10^{18}$ cm$^{-3}$ or more and a Ti/Pd/Au layer (20/20/100 nm). In the resonator 114, the first electrode 104, the semiconductor layer 102 including the RTD 101 having a diameter of 2 μm, the ohmic electrode 107 including Mo/Au (=50/200 nm) layers, the conductor 130 made of Cu, and the third electrode 103 including Ti/Au (=5/100 nm) layers are connected in this order. The RTD 101 is arranged at a position shifted from a centroid of the third electrode 103, which is a patch conductor, in the resonance direction by 80 μm.

Although the resonant frequency of the patch antenna is about 0.48 THz, the oscillation frequency (resonant frequency) $f_{THz}$ of the device 100 is about 0.45 THz in the light of the reactance of the RTD 101. Here, the width d of the area 106 was set to 10 μm, the height h thereof was set to 10

µm, and the height of the semiconductor layer 102 was set to 0.1 µm. The series resistance $R_m$ in Example 1 was about 0.2Ω.

The third electrode 103 is connected to the bias circuit 120 via the line 109. The third electrode 103 is connected to the line 109 at the node of the high-frequency electric field standing in the resonator 114 at the oscillation frequency $f_{THz}$ (=0.45 THz) to suppress the interference between the line 109 and the resonant electric field of the terahertz waves of the oscillation frequency $f_{THz}$. The capacitor 110 is an MIM capacitor and the capacitance of the capacitor 110 was set to 100 pF in the Example 1. The wiring 112 including wire bonding is connected to the capacitor 110 and the bias voltage of the RTD 101 is adjusted by the power supply 113.

The device 100 of Example 1 was manufactured through the following process. First, the following layers composing the semiconductor layer 102 were epitaxially grown on the InP substrate 108 using, for example, a molecular beam epitaxy (MBE) method or a metal-organic vapor phase epitaxy method. Specifically, the semiconductor layer 102 including the RTD 101 composed of n-InP/n-InGaAs and InGaAs/InAlAs layers was epitaxially grown. When an n-type conductive substrate was selected as the InP substrate 108, the epitaxial growth is started from the n-InGaAs layer.

Next, Mo/Au (=50/200 nm) layers used as the ohmic electrode 107 were formed on the semiconductor layer 102 including the RTD 101 using a sputtering method. Next, the ohmic electrode 107 and the semiconductor layer 102 including the RTD 101 were formed in a circular mesa shape having a diameter of 2 µm. The mesa shape was formed using electron beam (EB) lithography or photolithography and dry etching using inductively coupled plasma (ICP). Then, the first electrode 104 was formed on the etched surface by using a lift-off method. In addition, embedding and flattening with the BCB, which is used as the dielectric layer 105, were performed by using a spin coating method and a dry etching method.

Next, the BCB in the portion where the area 106 is to be formed was removed by using the photolithography and the dry etching to form the cavity 131. Then, part of the ohmic electrode 107 was made exposed. Here, use of the photolithography including gray-scale exposure allows the taper angle of the cavity 131 formed in the dielectric layer 105 to be arbitrarily controlled. Accordingly, the taper angle of the area 106 is capable of being arbitrarily controlled. Then, the via hole 131 was embedded with Cu, which is the conductor 130, so as to be in contact with the ohmic electrode 107 and the embedded via hole 131 was flattened by using the sputtering method, an electroplating method, and a chemical mechanical polishing method to form the area 106. Then, the third electrode 103 including the Ti/Au layers was formed by using the lift-off method.

Finally, the resonator 114 was connected to the wiring 112 and the power supply 113 with, for example, a shunt resistor or the wire bonding, which is used as the resistor 111, to complete the device 100. Power is supplied from the bias circuit 120 to the device 100. Upon application of the bias voltage, which normally produces the negative differential resistance region, to supply bias current to the device 100, the device 100 operates as an oscillator.

With the semiconductor device of Example 1, it is possible to reduce the loss of the electromagnetic waves in the oscillator including the terahertz resonator in which the RTD is integrated, compared with the related art, to generate or detect the terahertz waves more efficiently.

Example 2

In Example 2, a semiconductor device 800 (hereinafter referred to as a "device 800") will be described. The device 800 is an oscillator that produces the terahertz waves. FIG. 5 is a diagram for describing an exemplary configuration of the device 800. FIGS. 6A to 6C are cross-sectional views for describing the configuration of the device 800. Specifically, FIG. 6A is a cross-sectional view taken along VIA-VIA in FIG. 5, FIG. 6B is a cross-sectional view taken along VIB-VIB in FIG. 5, and FIG. 6C is a cross-sectional view taken along VIC-VIC in FIG. 5.

The device 800 has a structure for modulating each of the semiconductor devices described above in the first and second embodiments at high speed at 20 GHz.

The device 800 includes a resonator 814, a conductor 809, a shunt resistor 811, an insulator 815, a conversion unit 817, a coplanar line 818, a conductor 819, and a substrate 820.

The device 800 oscillates at the oscillation frequency $f_{THz}$=0.45 THz. The resonator 814 includes a third electrode 803, which is a patch conductor (hereinafter referred to as a "patch conductor 803"); a first electrode 804a, which is a ground conductor (hereinafter referred to as a "ground conductor 804a); a dielectric layer 805; and a semiconductor layer 802 including an RTD 801. The resonator 814 has the structure of a patch antenna in which the dielectric layer 805 composed of the BCB having a thickness of about 10 µm is sandwiched between the square patch conductor 803 having a side of 200 µm and the ground conductor 804a. The resonator 814 is described as the patch antenna 814 in the following description.

In the patch antenna 814, a semiconductor layer 804b, the RTD 801 having a diameter of 2 µb, an ohmic electrode 807 including Mo/Au (=50/200 nm) layers, a conductor 830 made of Cu, and the patch conductor 803 including Ti/Au (=5/200 nm) layers are connected in this order. In addition, in the patch antenna 814, the ground conductor 804a is disposed in contact with the semiconductor 804b. The ground conductor 804a is composed of Ti/Pd/Au (20/20/200 nm) layers and is connected to the semiconductor layer 804b composed of an n+-InGaAs (200 nm) layer having the electron concentration of $2 \times 10^{18}$ cm$^{-3}$ or more.

The RTD 801 in Example 2 uses the triple barrier RID of the InGaAs/InAlAs system described above in Example 1 and composes the semiconductor layer resulting from epitaxial growth of the InGaAs/InAlAs layers on the substrate 820 made of semi-insulating indium phosphide (having a relative dielectric constant smaller than or equal to 12). The RTD 801 is arranged at a position shifted from the centroid of the patch conductor 803 in the resonance direction by 80 µm.

The device 800 of Example 2 includes an area 806 in which the conductor 830 is embedded and which has a width of 10 µm and a height of 10 µm. The area 806 has a structure in which the ohmic electrode 807 is electrically connected to the patch conductor 803. The height of the semiconductor layer 802 was set to about 0.1 µm.

The patch conductor 803 is connected to the conversion unit 817 and the coplanar line 818 via a plug 816, which is a fifth conductor including Ti/Au (=5/200 nm) layers, and the conductor 809. In Example 2, the plug 816 was set to have a width of 6 µm and a height of 10 µm and the conductor 809 was set to have a width of 6 µm and a height of 150 µm.

The microstrip line composed of the conductor 809, the ground conductor 804a, the semiconductor layer 804b, and the insulator 815 is a lossy line within a range from several gigahertz to 100 gigahertz and has a structure to suppress the parasitic oscillation caused by the inductance of the conductor 809. A silicon nitride layer having a thickness of 100 nm was used as the insulator 815 in such a microstrip line.

In order to realize high-speed transmission at 20 GHz, the capacitances of the patch antenna 814 and the microstrip line were designed to be 0.3 pF or less.

The conductor 809 is connected to the ground conductor 804a via the shunt resistor 811. The shunt resistor 811 is composed of the semiconductor layer 804b and a contact resistance between the conductor 809 and the semiconductor layer 804b. The semiconductor layer 804b has a typical structure having a width of 5 μm, a length of 5 μm, and a thickness of 0.3 μm and includes the n+-InGaAs layer having the electron concentration of $2 \times 10^{18}$ cm$^{-3}$ or more. The shunt resistor 811 was designed to have a resistance of 5Ω to 10Ω. The shunt resistor 811 is insulated from the conductor 819 with the insulator 815.

The coplanar line 818 includes the conductor 819 (including Ti/Au (=5/200 nm) layers), which is a signal line, conductors 804c and 804d (including Ti/Au (=5/200 nm) layers), which are ground lines, and the substrate 820. The coplanar line 818 was designed to have a gap width w of 10 μm and a width s of the conductor 819 of 50 μm and to have a resistance of 50Ω at a frequency 20 GHz of carrier waves to be modulated when a thickness is of the substrate 820 was set to 0.5 mm.

The conversion unit 817 is a converter that converts the microstrip line including the conductor 809, the ground conductor 804a, the semiconductor layer 804b, and the insulator 815 and the coplanar line 818 at an impedance of 50Ω. Wiring including wire bonding and a power supply (which are not illustrated) are connected to the downstream of the coplanar line 818. The carrier waves of the bias voltage modulated at 20 GHz are transmitted to the RTD 801. The power supply (not illustrated) is desirably a high-frequency power supply.

With the semiconductor device of Example 2, it is possible to reduce the loss of the electromagnetic waves in the oscillator including the terahertz resonator in which the RTD is integrated, compared with the related art, to generate or detect the terahertz waves more efficiently.

In addition, the semiconductor device of Example 2 is capable of transmitting the carrier waves of 20 GHz from the patch antenna 814 at a baseband frequency of 0.45 THz. The configuration in Example 2 is capable of being used as a detector of the terahertz waves using non-linear photoresponse of the RTD 801. In this case, the RTD 801 operates as a detection element capable of receiving the carrier waves of 20 GHz at 0.45 THz.

The semiconductor device of Example 2 includes the area 806 including the conductor 830. Since the thickness of the dielectric of the patch antenna 814 is increased in such a configuration, it is possible to reduce the effect of the capacitance of the patch antenna 814 on the delay of the carrier waves in the gigahertz band (GHz band). Accordingly, the device 800 of Example 2 is preferably used when a transmitter-receiver of the patch antenna 814 in which a negative resistance device, such as the RTD 801, is integrated is used in high-speed high-capacitance communication.

While the invention is described in terms of some specific examples and embodiments, it will be clear that this invention is not limited to these specific examples and embodiments and that many changes and modified embodiments will be obvious to those skilled in the art within the spirit and scope of the invention.

For example, the RTDs in the semiconductor devices are not limited to the structures and the material systems described in the above embodiments and examples. RTDs having other structures and other combinations of materials may be used in the semiconductor devices. For example, an RTD having a triple-quantum well structure or an RTD having a multi-quantum well structure including a quadruple-quantum well structure may be used.

Any of the following combinations may be used as the material of the RTD:

GaAs/AlGaAs/ and GaAs/AlAs and InGaAs/GaAs/AlAs formed on a GaAs substrate

InGaAs/AlGaAsSb formed on an InP substrate

InAs/AlAsSb and InAs/AlSb formed on an InAs substrate

SiGe/SiGe formed on a Si substrate

The material of the RTD may be arbitrarily selected from the above structures and materials depending on, for example, a desired frequency.

Although the carrier waves are supposed to be electrons in the above embodiments and examples, the carrier waves are not limited to this. The carrier waves may be positive holes. The materials of the substrate and the dielectric may be selected depending on their applications. Semiconductor, such as silicon, gallium arsenide, indium arsenide, or gallium phosphide, or resin, such as glass, ceramics, Teflon (registered trademark), or ethylene terephthalate, may be used as the materials of the substrate and the dielectric.

Although the square patch is used as the terahertz resonator in the above embodiments and examples, the shape of the resonator is not limited to this. For example, a resonator or the like of a structure using a patch conductor of a polygonal shape, such as a rectangular shape or a triangular shape, a circular shape, or an elliptical shape may be used.

The number of negative differential resistance devices integrated in the semiconductor device is not limited to one. A resonator including multiple negative differential resistance devices may be used. The number of lines is not limited to one and multiple lines may be provided.

The configurations of the semiconductor devices described in the above embodiments and examples may be combined. For example, the semiconductor layer 102 and the ohmic electrodes 507a and 507b in the semiconductor device 500 may be coated with the insulating layer 715 in FIG. 4C. In addition, the shapes of the areas 606a and 606b in the semiconductor device 600 may be changed to a tapered shape. The shape of the areas is not limited to this and the configurations of the semiconductor devices may be arbitrarily combined.

Although the cavity (via hole) formed in the dielectric layer 105 is filled with the conductor or the surface of the cavity is covered with the conductor in the above embodiments and examples, a covering layer made of a material different from that of the conductor may be provided on the surface of the cavity. For example, in the case of the device 100 in Example 1, a covering layer made of a material different from that of the conductor 130 is formed on the surface of the cavity 131. After the covering layer is arranged, the formed cavity is filled with the conductor 130 or the surface of the formed cavity is covered with the conductor 130 to form the area 106.

The terahertz waves are capable of being generated and detected by using the semiconductor devices described in the above embodiments and examples.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-120403, filed Jun. 15, 2015 and No.

2016-096255, filed May 12, 2016, which are hereby incorporated by reference herein in their entirety.

The invention claimed is:

1. A semiconductor device that generates or detects terahertz waves, the semiconductor device comprising:
a substrate; and
a resonator configured to resonate the terahertz waves and provided on the substrate, the resonator comprising:
a semiconductor layer configured to have a gain of terahertz waves;
a first electrode configured to be connected to the semiconductor layer;
a second electrode configured to be arranged at a side opposite to the side at which the first electrode is arranged with respect to the semiconductor layer and to be electrically connected to the semiconductor layer;
a third electrode configured to be arranged at a side opposite to the side at which the first electrode is arranged with respect to the semiconductor layer, the semiconductor layer and the second electrode being arranged between the first electrode and the third electrode;
a conductor electrically connecting the second electrode to the third electrode, the conductor being arranged between the substrate and the third electrode; and
a dielectric layer configured to be arranged around the conductor, the semiconductor layer and the second electrode and between the first electrode and the third electrode and to be thicker than the semiconductor layer,
wherein a thickness of the conductor is greater than a thickness of the semiconductor layer,
wherein, in a plan view, an outline of the semiconductor layer is entirely included in an outline of the third electrode, and
wherein a greatest width of the conductor is $1/10$ of an effective wavelength in the dielectric layer of the terahertz waves resonating in the resonator or less.

2. The semiconductor device according to claim 1, wherein the conductor contains a material resistivity of which is $1\times10^{-6}$ Ω-m or less.

3. The semiconductor device according to claim 1, wherein the conductor contains metal resistivity of which is $1\times10^{-6}$ Ω-m or less.

4. The semiconductor device according to claim 1, wherein a width of a face of the conductor at the third electrode side is 20 times or less of a width of a face of the conductor at the second electrode side.

5. The semiconductor device according to claim 1, wherein a width of a face of the conductor at the third electrode side is 10 times or less of a width of a face of the conductor at the second electrode side.

6. The semiconductor device according to claim 1, wherein a width of the face of the conductor at the third electrode side is greater than or equal to a width of the face of the conductor at the second electrode side.

7. A semiconductor device, that generates or detects terahertz waves, the semiconductor device comprising:
a substrate; and
a resonator configured to resonate the terahertz waves and provided on the substrate, the resonator comprising:
a semiconductor layer configured to have a gain of terahertz waves;
a first electrode configured to be connected to the semiconductor layer;
a second electrode configured to be arranged at a side opposite to the side at which the first electrode is arranged with respect to the semiconductor layer and to be electrically connected to the semiconductor layer;
a third electrode configured to be arranged at a side opposite to the side at which the first electrode is arranged with respect to the semiconductor layer, the semiconductor layer and the second electrode being arranged between the first electrode and the third electrode;
a conductor electrically connecting the second electrode to the third electrode, the conductor being arranged between the substrate and the third electrode; and
a dielectric layer configured to be arranged around the conductor, the semiconductor layer and the second electrode and between the first electrode and the third electrode and to be thicker than the semiconductor layer,
wherein a thickness of the conductor is greater than a thickness of the semiconductor layer,
wherein, in a plan view, an outline of the semiconductor layer is entirely included in an outline of the third electrode, and
wherein a thickness of the conductor is greater than a thickness of the third electrode and is $1/10$ or less of an effective wavelength in the dielectric layer of the resonating terahertz waves.

8. A semiconductor device that generates or detects terahertz waves, the semiconductor device comprising:
a substrate; and
a resonator configured to resonate the terahertz waves and provided on the substrate, the resonator comprising:
a semiconductor layer configured to have a gain of terahertz waves;
a first electrode configured to be connected to the semiconductor layer;
a second electrode configured to be arranged at a side opposite to the side at which the first electrode is arranged with respect to the semiconductor layer and to be electrically connected to the semiconductor layer;
a third electrode configured to be arranged at a side opposite to the side at which the first electrode is arranged with respect to the semiconductor layer, the semiconductor layer and the second electrode being arranged between the first electrode and the third electrode;
a conductor electrically connecting the second electrode to the third electrode, the conductor being arranged between the substrate and the third electrode; and
a dielectric layer configured to be arranged around the conductor, the semiconductor layer and the second electrode and between the first electrode and the third electrode and to be thicker than the semiconductor layer,
wherein a thickness of the conductor is greater than a thickness of the semiconductor layer,
wherein, in a plan view, an outline of the semiconductor layer is entirely included in an outline of the third electrode, and
wherein a thickness of the dielectric layer is greater than the thickness of the semiconductor layer and is $1/10$ or less of an effective wavelength in the dielectric layer of the resonating terahertz waves.

9. The semiconductor device according to claim 1, wherein the semiconductor layer is ohmically connected to the second electrode.

10. The semiconductor device according to claim 1, further comprising:

a fourth electrode configured to be arranged at the side at which the first electrode is arranged with respect to the semiconductor layer and to be electrically connected to the semiconductor layer, wherein the dielectric layer includes a second conductor that electrically connects the first electrode to the fourth electrode and that is different from the conductor electrically connecting the second electrode to the third electrode.

11. The semiconductor device according to claim 10, wherein the semiconductor layer is ohmically connected to the fourth electrode.

12. The semiconductor device according to claim 1, wherein the semiconductor layer includes a resonant tunneling diode.

13. The semiconductor device according to claim 1, wherein the resonator includes a patch antenna.

14. The semiconductor device according to claim 13, further comprising:
  a power supply configured to supply bias voltage to the semiconductor layer; and
  a bias circuit configured to connect the resonator to the power supply,
  wherein the bias circuit includes a strip line, a plug for connecting the strip line to the resonator, a decoupling capacitor and a shunt resistor that are connected to the strip line and that are connected in parallel to the semiconductor layer, a coplanar line connected to the power supply, and a converter that converts impedance of the strip line and impedance of the coplanar line.

15. The semiconductor device according to claim 14, wherein the plug is arranged at a node of an electric field of the terahertz waves, which stands in the resonator.

16. The semiconductor device according to claim 1, further comprising:
  a bias circuit configured to supply bias voltage to the semiconductor layer; and
  a line configured to connect the third electrode to the power supply.

* * * * *